United States Patent
Wajima

(10) Patent No.: US 6,570,262 B1
(45) Date of Patent: May 27, 2003

(54) MOTHER SUBSTRATE AND ELECTRONIC COMPONENT UTILIZING THE MOTHER SUBSTRATE

(75) Inventor: Masaya Wajima, Shinminato (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 09/525,077

(22) Filed: Mar. 14, 2000

(30) Foreign Application Priority Data

Apr. 2, 1999 (JP) .......................................... 11-095952

(51) Int. Cl.[7] .......................................... H01L 23/544
(52) U.S. Cl. ........................ 257/797; 438/460; 438/438
(58) Field of Search ................................. 438/460, 438, 438/257; 257/797, 622

(56) References Cited

U.S. PATENT DOCUMENTS

| | | | | |
|---|---|---|---|---|
| 4,202,007 A | * | 5/1980 | Dougherty et al. | ......... 174/260 |
| 4,527,010 A | * | 7/1985 | Anazawa et al. | .......... 174/52.4 |
| 5,506,463 A | | 4/1996 | Yoshimoto et al. | |
| 5,607,535 A | | 3/1997 | Tsukada et al. | |
| 6,219,912 B1 | * | 4/2001 | Shimizu et al. | ............. 174/250 |

FOREIGN PATENT DOCUMENTS

| | | | | |
|---|---|---|---|---|
| JP | 355061050 A | * | 5/1980 | ................. 257/621 |
| JP | 58-139613 | | 8/1983 | |
| JP | 7-335995 | | 12/1995 | |
| JP | 8-97674 | | 4/1996 | |
| JP | 8-293752 | | 11/1996 | |
| JP | 2000133894 A | * | 5/2000 | |
| JP | 02000133894 A | * | 5/2000 | ........................ 1/2 |

OTHER PUBLICATIONS

Japanese Application No. 09148875, Patent Abstracts of Japan, Date of Publication Jun. 1997, Hirota Mutsuaki, Kyocera Corp., "Piezoelectric Vibrator and Manufacture Therefor".

* cited by examiner

Primary Examiner—Amir Zarabian
Assistant Examiner—Kiesha Rose
(74) Attorney, Agent, or Firm—Keating & Bennett, LLP

(57) ABSTRACT

An apparatus and method for manufacturing substrate elements includes providing a mother substrate, and forming a plurality of through-holes on first lines and second lines opposing each other across sections on the mother substrate. The sections define each of the substrate elements to be formed. The through-holes on the first lines are disposed alternately with respect to the through-holes on the second lines. Electrodes are also provided on the principal plane of the mother substrate and on the inner surfaces of the through-holes. Then, the mother substrate is cut along cut lines in the vertical and horizontal directions.

11 Claims, 13 Drawing Sheets

MOTHER SUBSTRATE AND ELECTRONIC COMPONENT UTILIZING THE MOTHER SUBSTRATE

BACKGROUND OF THE INVENTION

1. Field of the Invention

The present invention relates to mother substrates, substrate elements, and methods for manufacturing the same. In particular, the present invention relates to a mother substrate for manufacturing substrate elements including electronic elements such as resonators and filters.

2. Description of the Related Art

Known technologies related to the present invention are disclosed in, for example, Japanese Unexamined Patent Application Publication Nos. 8-293752, 58-139513, 8-97674, and 7-335995.

A conventional method in which electrode patterns are formed on a mother substrate, and where substrate elements are obtained by cutting the mother substrate into a plurality of pieces has been widely used. In the conventional method, a mother substrate 1, for example, as shown in FIG. 20 is used. The mother substrate 1 shown in FIG. 20 is provided with through-holes 4 at positions corresponding to the four corners and intermediate parts of lateral sides of each substrate element 3. Electrodes 2 are provided on the inner surface of each through-hole 4 and on the principal plane of each substrate element 3. The mother substrate 1 is cut by a dicer or other similar cutting devices along cut lines, thereby obtaining the substrate element 3 shown in FIG. 21.

However, according to the conventional method, a problem occurs in that a plurality of molds used for forming the mother substrates, are required to be provided with pins according to the number of through-holes 4 of the substrate elements 3, thereby increasing the cost of the molds, whereby manufacturing costs of the substrate elements 3 are increased. Moreover, in the method in which the mother substrate 1 is provided with a plurality of the through-holes 4 at the location of the lateral sides of the substrate elements 3, short circuits between electrodes 2 and the cracking of the substrates are likely to occur when the through-holes 4 are too close to each other, so that miniaturization of the substrate elements 3 is prevented. Furthermore, in the substrate element 3 having a large number of through-holes 4, a problem has been found in that the area of the substrate element 3 in which a sealing material and a conductive material are provided is limited. These materials must be applied so as not to penetrate into the through-holes 4 when the substrate element 3 is connected with an electronic device element or a packaging substrate. By reducing the area for the sealing material and the conductive material, the reliability of produced electronic devices is lowered. In order to resolve these problems, the substrate element 3 must be made large, which is prevents miniaturization of the substrate and the component.

SUMMARY OF THE INVENTION

In order to overcome the problems described above, preferred embodiments of the present invention provide an apparatus and method of manufacturing substrate elements which are obtained from a mother substrate which reduces the manufacturing cost of the substrate elements, minimizes the size of the substrate elements and increases the reliability of the electronic devices.

According to a first preferred embodiment of the present invention, a mother substrate for forming substrate elements by cutting the mother substrate along a plurality of cut lines that are substantially parallel to each other includes a region in which a plurality of through-holes are provided, at a predetermined distance from each other, on each of the plurality of cut lines. The through-holes on each of the plurality of cut lines are disposed alternately with the through-holes on an adjacent cut line.

According to a second preferred embodiment of the present invention, a mother substrate is provided with sections that are disposed in the vertical and horizontal directions. The sections are associated with substrate elements to be formed by cutting the mother substrate along cut lines extending in the vertical and horizontal directions. A plurality of first cut lines extend along a line and opposes one another across the section associated with each of the substrate elements to be formed. A plurality of first through-holes are provided on the first cut line and disposed at a predetermined distance from each other. A plurality of second cut lines extend along another line and also opposes one another across the section associated with each of the substrate elements to be formed. A plurality of second through-holes are provided on the second cut line and disposed at a predetermined distance from each other. The first through-holes and the second through-holes are disposed alternately with respect to each other such that a first line that passes through the first through-holes and extends substantially perpendicularly to the first cut line is separated from a second line that passes through the second through-holes, and which extends substantially perpendicularly to the second cut line.

According to a third preferred embodiment of the, present invention, a substrate element is manufactured by a method including the steps of providing a mother substrate for forming substrate elements, forming a plurality of through-holes disposed at a predetermined distance from each other on each of plurality of cut lines on the mother substrate, forming through-holes on each of the plurality of cut lines to be disposed alternately with the through-holes on an adjacent cut line, and cutting the mother substrate along the cut lines.

According to a fourth preferred embodiment of the present invention, a method of manufacturing a substrate element includes the steps of providing a mother substrate having sections which are disposed in vertical and horizontal directions, forming a plurality of first cut lines extending along a line and opposing one another across the section associated with each of the substrate elements to be formed, forming a plurality of first through-holes on the first cut line and disposed at a predetermined distance from each other, forming a plurality of second cut lines extending on another line and opposing one another across the section associated with each of the substrate elements to be formed, forming a plurality of second through-holes on the second cut line and disposed at a predetermined distance from each other, the first through-holes and the second through-holes being disposed alternately with each other such that a first line which passes through the first through-holes and extends substantially perpendicular to the first cut line is separated from a second line which passes through the second through-holes and extends substantially perpendicular to the second cut line, and cutting the mother substrate along the cut lines.

According to a fifth preferred embodiment of the present invention, a method for manufacturing substrate elements includes the steps of providing a mother substrate having a plurality of through-holes disposed on first lines and second lines opposing each other across sections associated with substrate elements to be formed, the through-holes on the first lines being disposed alternately with the through-holes on the second lines, forming electrodes on the principal plane of the mother substrate and on the inner surfaces of the through-holes, and cutting the mother substrate along the first and second lines.

According to a sixth preferred embodiment of the present invention, an electronic device includes a substrate element manufactured by a method including the steps of providing a mother substrate for forming substrate elements having a plurality of cut lines parallel to each other, forming a plurality of through-holes disposed at a predetermined distance from each other on each of the plurality of cut lines, forming the through-holes on each of the plurality of cut lines to be alternately disposed with the through-holes on an adjacent cut line, and cutting the mother substrate along the cut lines. The electronic device also includes an electronic device element mounted on the substrate element.

According to a seventh preferred embodiment of the present invention, an electronic device includes a substrate element manufactured by a method including the steps of providing a mother substrate having sections and disposed in the vertical and horizontal directions, the sections being associated with substrate elements to be formed, forming a plurality of first cut lines extending along a line and opposing one another across the section associated with each of the substrate elements to be formed, forming a plurality of first through-holes on the first cut line and disposed at a predetermined distance from each other, forming a plurality of second cut lines extending on another line and opposing one another across the section associated with each of the substrate elements to be formed, forming a plurality of second through-holes on the second cut line and disposed at a predetermined distance from each other, the first through-holes and the second through-holes being alternately disposed with each other such that a first line that passes through the first through-holes and extends substantially perpendicular to the first cut line is separated from a second line that passes through the second through-holes and extends substantially perpendicularly to the second cut line, and cutting the mother substrate along the cut lines. The electronic device also includes an electronic device element mounted on the substrate element.

The mother substrate according to preferred embodiments of the present invention is provided with through-holes disposed in a staggered way at the lateral sides of each section associated with a substrate element, thereby reducing the number of through-holes as a whole, which reduces the manufacturing cost of the substrate elements. Also, the substrate elements can be further miniaturized. Furthermore, by reducing the number of through-holes, the area in which sealing materials and conductive materials are applied is increased, whereby much more reliable electronic devices can be provided.

Other features, elements and advantages of the present invention will be described in detail below with reference to preferred embodiments of the present invention and the attached drawings.

BRIEF DESCRIPTION OF THE ATTACHED DRAWINGS

DETAILED DESCRIPTION OF PREFERRED EMBODIMENTS

Figure 1:
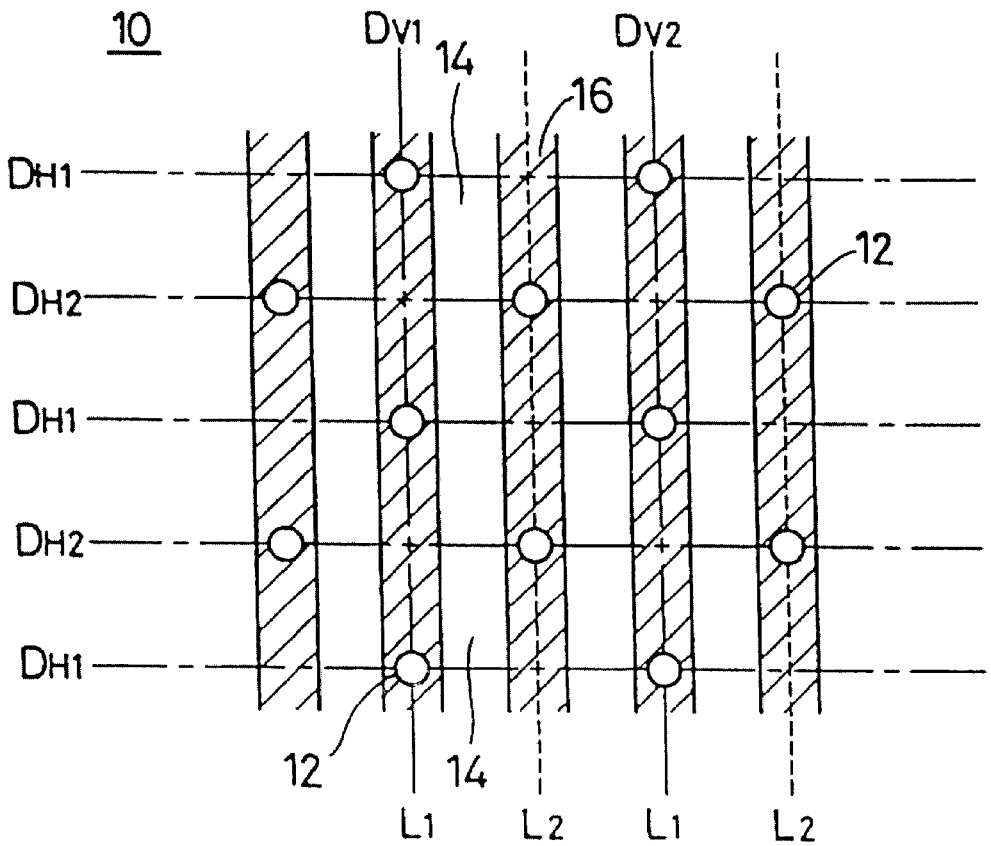
FIG. 1 is a plan view of a mother substrate according to a first preferred embodiment of the present invention.
Figure 2:
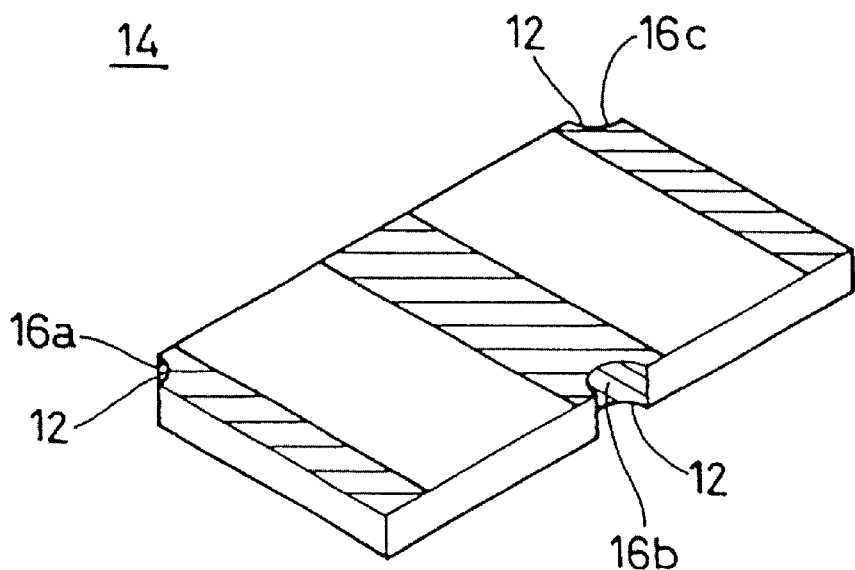
FIG. 2 is a perspective view of a substrate element obtained from the mother substrate shown in FIG. 1.

FIG. 1 is a plan view of a mother substrate according to a first preferred embodiment of the present invention. FIG. 2 is a perspective view of a substrate element obtained from the mother substrate shown in FIG. 1.

A mother substrate 10 according to the present preferred embodiment shown in FIG. 1 is preferably substantially rectangular. The mother substrate 10 includes regions that are substantially vertically and horizontally disposed thereon, and which are to be cut along a plurality of cut lines D into a plurality of substrate elements 14, as described below. According to the first preferred embodiment in FIG. 1, the cut lines D include horizontal cut lines $D_{H1}$ and $D_{H2}$ and vertical cut lines $D_{V1}$ and $D_{V2}$ arranged to define a grid. Each region enclosed by the cut lines $D_{H1}$, $D_{H2}$, $D_{V1}$, and $D_{V2}$ defines a substrate element 14.

The mother substrate 10 is preferably made of a material such as a synthetic resin or a dielectric. The mother substrate 10 is provided with a plurality of through-holes 12, as shown in FIG. 1. The through-holes 12 pass through the mother substrate 10 in the thickness direction thereof.

The configuration of the through-holes 12 is described with a linear first cut line $D_{H1}$ and a second cut line $D_{H2}$ disposed on the mother substrate 10 as a base, extending substantially parallel to each other and at substantially the same distance from each other as the width of the substrate element 14. The first cut line $D_{H1}$ and the second cut line $D_{H2}$ are cut lines that extend horizontally on the mother substrate 10, the first cut line $D_{H1}$ and the second cut line $D_{H2}$ being repeatedly disposed at a predetermined distance in the vertical direction of the mother substrate 10.

A plurality of the through-holes 12 are located on each of the first cut lines $D_{H1}$ at a predetermined distance from each other. A plurality of the through-holes 12 are also located on each of the second cut lines $D_{H2}$ disposed substantially parallel to the first cut lines $D_{H1}$ at a predetermined distance from each other.

The through-holes 12 on the first cut lines $D_{H1}$ and the through-holes 12 on the second cut lines $D_{H2}$ are disposed alternately With each other at both lateral sides of a region defining the substrate element 14. That is, the through-holes 12 are arranged so that a first line $L_1$ extending substantially perpendicularly to the first cut lines $D_{H1}$ and on the through-holes 12 located on the first cut lines $D_{H1}$ is not disposed on a second line $L_2$ extending substantially perpendicularly to the second cut lines $D_{H2}$ and on the through-holes 12 located on the second cut lines $D_{H2}$. According to the present preferred embodiment shown in FIG. 1, the first line $L_1$ is disposed on the vertical cut line $D_{V1}$ while the second line $L_2$ is not disposed on the vertical cut line $D_{V2}$. The first line $L_1$ and the second line $L_2$ are imaginary lines shown by dashed lines in FIG. 1, and which are provided for clarity and the lines do not exist on the products to be produced. The through-holes 12 may be formed either by molding the mother substrate 10 by using a mold having a plurality of protrusions or by machining the prepared substantially rectangular mother substrate 10.

The mother substrate 10 is provided on the principal plane thereof with a plurality of zonal electrode patterns 16 extending substantially parallel to each other along the through-holes 12. The electrode patterns 16 are also provided on the entire inner surface of each through-hole 12. The electrode patterns 16 on the principal plane of the mother substrate 10 are electrically connected to the electrode patterns 16 provided on the inner surfaces of the through-holes 12. The electrode patterns 16 on the inner surfaces of the through-holes 12 define side-surface electrodes of the substrate elements 14. The electrode patterns 16 are preferably formed by a method or a combination of methods selected from methods such as printing, sintering, evaporating, and plating, the method or the combination of methods being selected according to the material and the use of the substrate.

A preferred method for forming the electrode patterns 16 is described below. Prior to forming the electrode patterns 16, the surface of the mother substrate 10 is activated by roughening the surface with a solvent, an acid, an alkali, or other similar substances, or by coating the surface with a catalyst for plating.

Then, a metallic film is deposited on the entire surface of the mother substrate 10 by electroless-plating a copper film on the surface. The metallic film is deposited also to cover the inner surfaces of the through-holes 12.

Note that the material of the metallic film, besides copper, may also be made of silver, gold, palladium, and aluminum, or an alloy thereof. The metallic film may be overlaid, as needed, with another metallic film of one of these materials by electroplating.

A resist is then coated on the entire surface of the mother substrate 10 having the metallic film. The resist is arranged so as to cover the entire outer surface of the metallic film.

A mask having a plurality of openings is provided on the mother substrate 10. The openings are formed to be associated with the portions of the substrate element, to be produced, in which electrodes will not be formed.

Then, diffused beams are applied to the mask, and the resist layer under the openings of the mask is exposed thereto. In this case, the inner surfaces of the through-holes 12 are also exposed to the beams which are applied in a diffused manner. The diffused beams are obtained by an appropriate diffuser disposed between a light source and the mask, by moving the light source so as to oppose the mask and the mother substrate 10, or by moving the mask and the mother substrate 10 so as to oppose the light source. For this purpose, for example, a commercial scanning-type exposure apparatus is preferably used.

The resist layer is developed, and the exposed portion of the resist layer is removed by using a strong acid such as nitric acid. Then, the metallic film is removed by etching the portion in which the resist layer was removed. The remaining parts of the resist layer which have not been exposed and have not been etched are removed by a solvent having, for example, about 65% by weight aromatic hydrocarbon, about 20% by weight alkyl sulfonic acid, and about 15% by weight alkyl hydroxybenzene. By this preferred method, the electrode patterns 16 are formed on the mother substrate 10.

Figure 21:
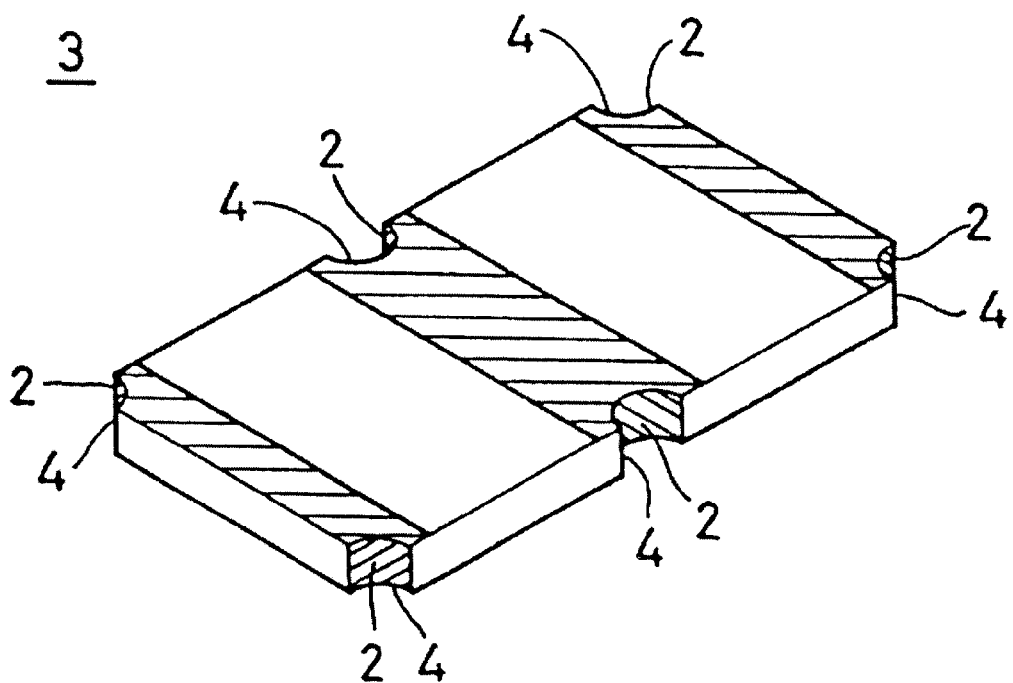
FIG. 21 is a perspective view of a substrate element obtained from the conventional mother substrate shown in FIG. 20.

Thereafter, the mother substrate 10 is cut along the cut lines D by a dicer or other cutting apparatuses into a plurality of the substrate elements 14. Each substrate element 14 shown in FIG. 2 includes a terminal electrode 16b provided on the inner surface of the through-hole 12 which is formed substantially in a shape of the letter U at one of the lateral side surfaces, which oppose each other in the width direction, and includes terminal electrodes 16a and 16c provided on the inner surfaces of the through-holes 12 which are formed substantially in a shape of the letter U at the both ends of the other lateral side surface of the substrate element 14. The terminal electrodes 16a and 16c and the terminal electrode 16b are arranged in a staggered way on each of the lateral side surfaces, which oppose each other in the width direction of the substrate element 14. In other words, while in the conventional mother substrate, a plurality of pairs of through-holes are formed such that the pairs of through-holes oppose each other in the width direction, as shown in FIG. 21. The substrate element 14 according to the present preferred embodiment is preferably provided with only one through-hole 12 at positions that oppose each other in the width direction on the lateral side surfaces of the substrate element 14, as shown in FIG. 2. Each of the through-holes 12 is provided with the terminal electrode 16a, 16b, or 16c. The terminal electrodes 16a, 16b, and 16c are extended to be exposed on the principal plane of the substrate element 14. The mother substrate 10 may be cut by a dicer or by other cutting apparatuses.

According to the present preferred embodiment described above, the number of through-holes can be reduced by half compared to the conventional method for manufacturing substrate elements. As a result, the molding costs and the machining costs are greatly reduced, thereby reducing the manufacturing cost of each substrate element 14. The substrate element 14 according to the present preferred embodiment includes the through-holes 12 arranged in a staggered manner, whereby electrical short-circuits between the plurality of through-holes 12 and mechanical breakage of the substrate element 14 are prevented, thereby enabling further miniaturization of the substrate element 14.

Figure 3:
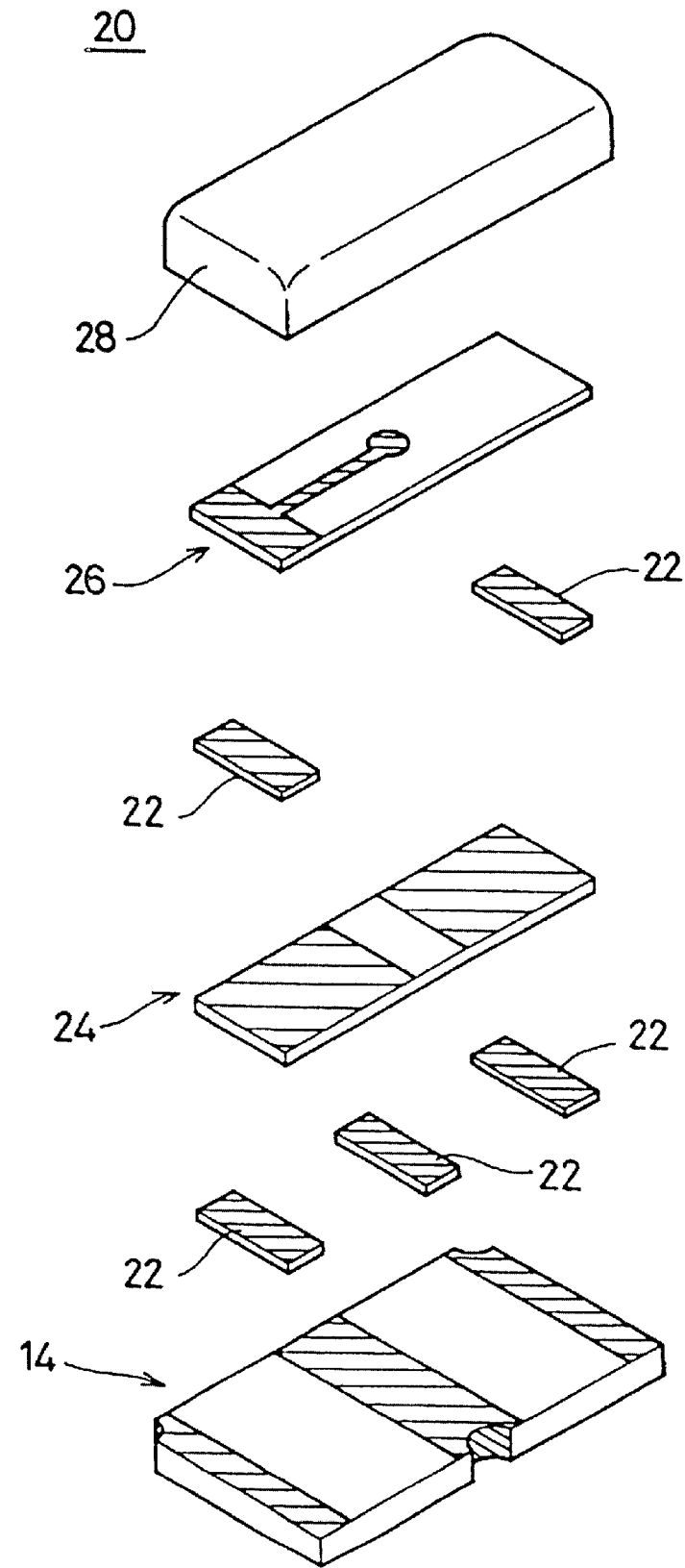
FIG. 3 is an exploded perspective view of an electronic device including the substrate element shown in FIG. 2.

FIG. 3 is an exploded perspective view of an electronic device using the substrate element 14 shown in FIG. 2. The electronic device 20 shown in FIG. 2 is a built-in-load-capacitance-type surface-mounting resonator. The electronic device 20 includes the substrate element 14. The substrate element 14 is provided thereon with a capacitor 24 fixed thereto through, for example, three first conductive chips 22. The capacitor 24 includes electrodes (not shown) provided on the bottom surface thereof, the electrodes being electrically connected to the terminal electrodes 16a, 16b, and 16c of the substrate element 14 through the electrode patterns provided on the substrate element 14 and the first conductive chips 22. The capacitor 24 is provided thereon with a piezoelectric resonator 26 fixed thereto through, for example, two second conductive chips 22. The piezoelectric resonator 26 is provided on the bottom surface with two electrodes (not shown), the electrodes being connected to two electrodes provided on the upper surface of the capacitor 22 through the second conductive chips 22. The piezoelectric resonator 26 is supported by the second conductive chips 22 only in the vicinity of the longitudinal ends of the piezoelectric resonator 26, so that the vibration thereof is not suppressed. The electronic device 20 includes a cap 28 which covers the device. The electronic device 20 thus obtained is coated with liquid conductive material and sealing material at the bottom surface, and is surface-mounted on an electronic circuit board.

Figure 4:
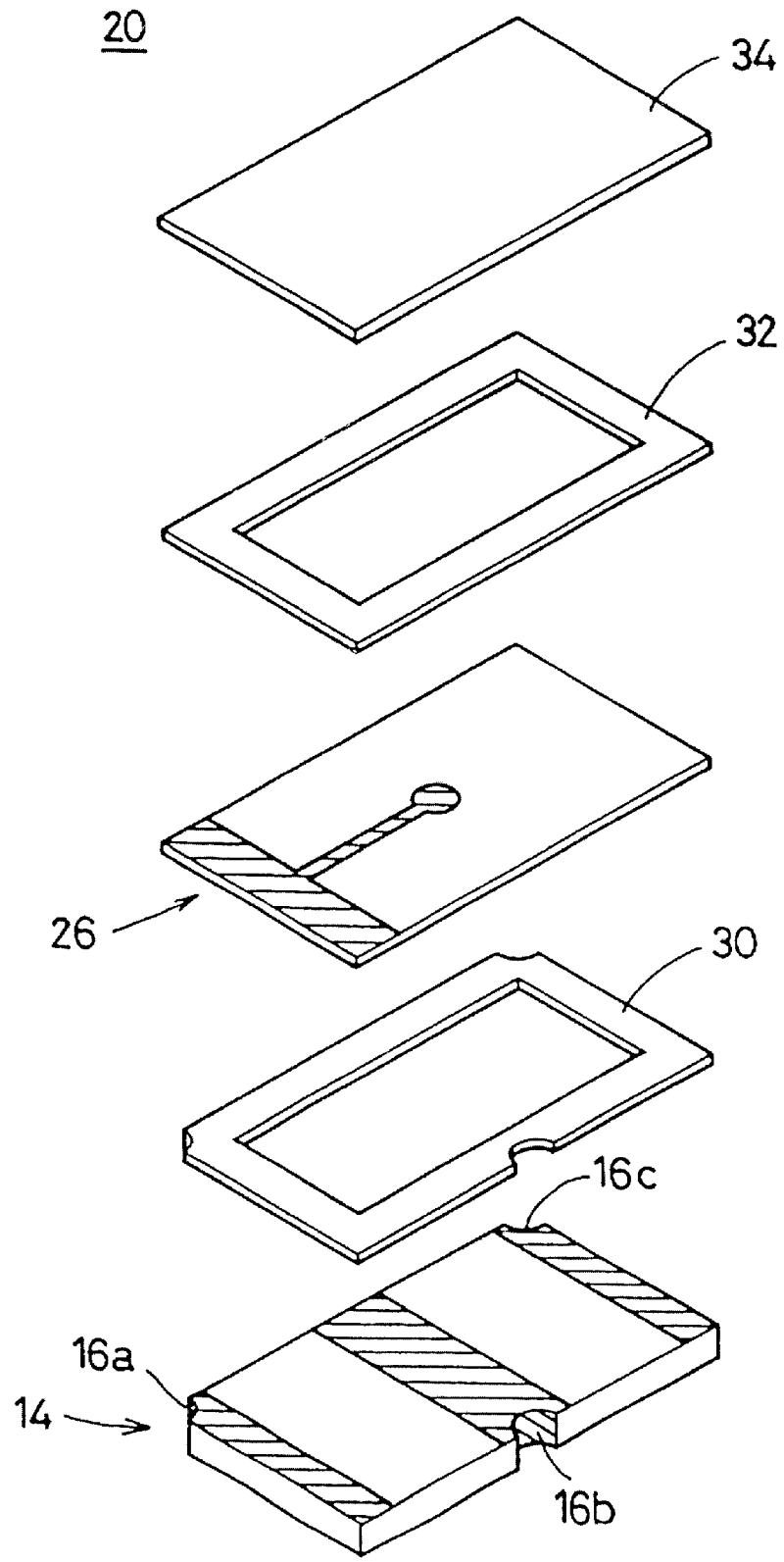
FIG. 4 is an exploded perspective view of another electronic device including the substrate element shown in FIG. 2.

FIG. 4 is an exploded perspective view of another electronic device using the substrate element shown in FIG. 2. The electronic device 20 shown in FIG. 4 includes the substrate element 14 shown in FIG. 2. The substrate element 14 used in this case is preferably made of a material having a high dielectric constant to form load capacitance. The load capacitance is provided between the terminal electrodes 16a and 16b and between the terminal electrodes 16b and 16c. The substrate element 14 is provided thereon with a piezoelectric resonator 26 fixed thereto through an anisotropically conductive member 30 having, for example, a frame shape. The anisotropically conductive member 30 is conductive only in the thickness direction. One of the electrodes (not shown), which longitudinally oppose each other, provided on the bottom surface of the piezoelectric resonator 26 is electrically connected to the terminal electrode 16a of the substrate element 14 which longitudinally opposes the terminal electrode 16c, and the other one of the electrodes (not shown), which longitudinally oppose each other, provided on the bottom surface of the piezoelectric resonator 26 is electrically connected to the terminal electrode 16c of the substrates element 14 which longitudinally opposes the terminal electrode 16a. The anisotropically conductive member 30 is provided with three cut-away parts arranged to be associated with the through-holes 12 of the substrate element 14. The piezoelectric resonator 26 includes thereon an upper substrate 34 fixed thereto through an adhesive 32 having a frame shape. The electronic device 20 shown in FIG. 4 is provided with spaces above and under the piezoelectric resonator 26 by forming the anisotropically conductive member 30 and the adhesive 32 to have a predetermined thickness and a frame shape, thereby avoiding suppression of the vibration of the piezoelectric resonator 26. The electronic device 20 thus obtained is coated with liquid conductive material and sealing material on the bottom surface and is surface-mounted on an electronic circuit board.

The electronic devices 20 shown in FIG. 3 and FIG. 4 include the substrate elements 14 in which the number of through-holes 12 is reduced by half compared to the conventional substrate element, whereby a large area of conductive members and insulating members can be provided although the electronic devices 20 are miniaturized, thereby providing highly reliable electronic devices.

Figure 5:
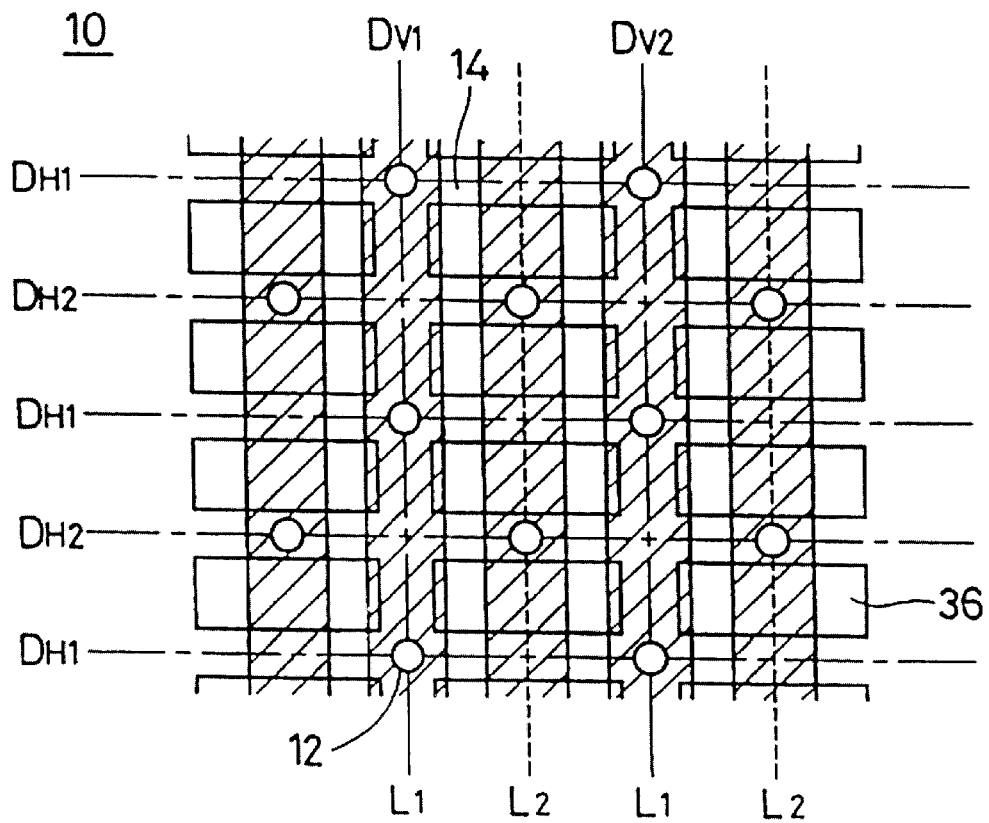
FIG. 5 is a plan view of a mother substrate according to a second preferred embodiment of the present invention.
Figure 6:
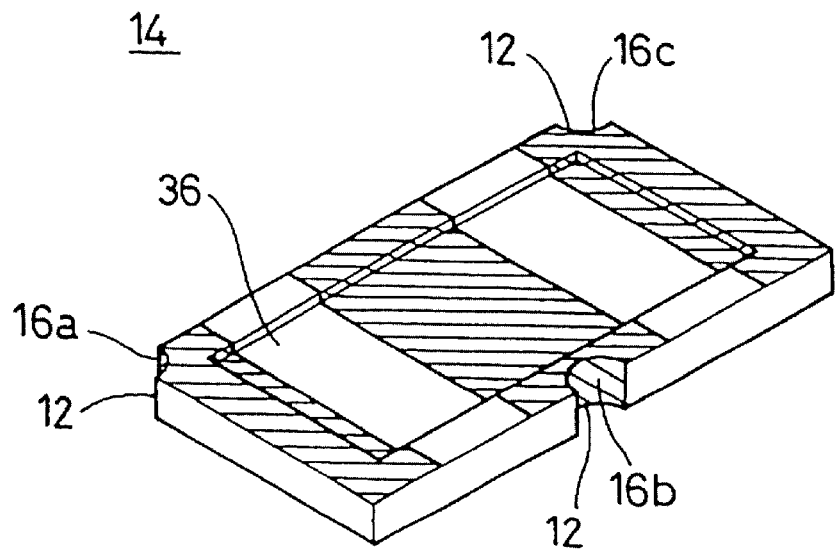
FIG. 6 is a perspective view of a substrate element obtained from the mother substrate shown in FIG. 5.

FIG. 5 is a plan view of a mother substrate according to a second preferred embodiment of the present invention. FIG. 6 is a perspective view of a substrate element 14 obtained from the mother substrate shown in FIG. 5.

A mother substrate 10 shown in FIG. 5 is different from the mother substrate 10 shown in FIG. 1 in that the mother substrate 10 shown in FIG. 5 includes a recess 36 having a substantially rectangular shape, in plan view, in a region on the principal plane of the mother substrate 10 in which each substrate element 14 is formed. The recess 36 receives therein an electronic device element of an electronic device such as the piezoelectric resonator 26. The substrate element 14 shown in FIG. 6 can be obtained from the mother substrate 10 shown in FIG. 5. The substrate element 14, provided with the recess 36 for receiving an electronic device element, can be applied to various uses.

Figure 7:
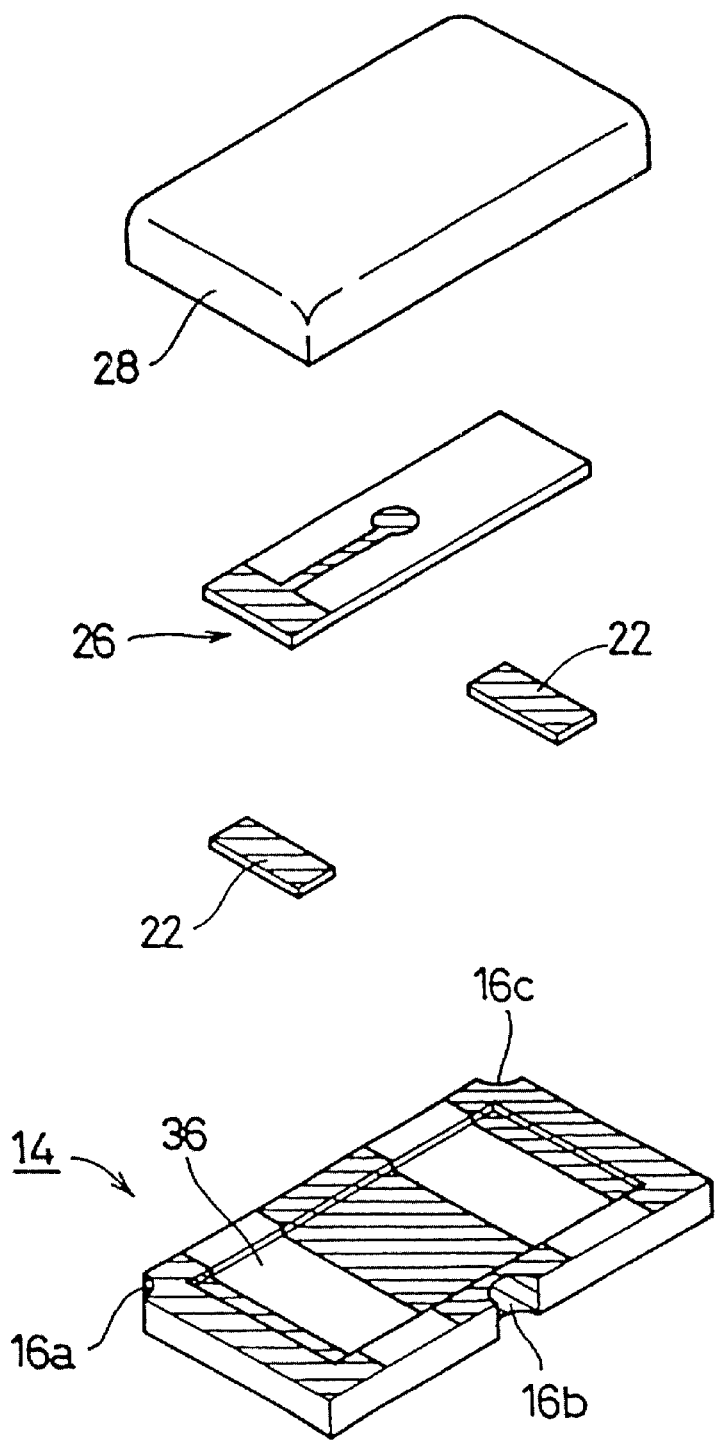
FIG. 7 is an exploded perspective view of an electronic device including the substrate element shown in FIG. 6.

FIG. 7 is an exploded perspective view of an electronic device 20 including the substrate element 14 shown in FIG. 6. The substrate element 14 included in the electronic device 20 shown in FIG. 7 is made of a material having a high dielectric constant for forming load capacitance. The substrate element 14 is provided with the recess 36 on the principal plane thereof. The recess 36 includes terminal electrodes 16a, 16b, and 16c being led to be exposed therein. The recess 36 of the substrate element 14 receives therein a piezoelectric resonator 26. Each of the electrodes (not shown), arranged on the bottom surface and longitudinally opposing each other, is connected to the terminal electrode 16a or 16c through conductive chips 22, the terminal electrodes 16a and 16c opposing each other in the longitudinal direction of the substrate element 14. The piezoelectric resonator 26 and the recess 36 are covered by a cap 28. Since the electronic device 20 includes the recess 36 provided on the principal plane of the substrate element 14, the thickness of the electronic device 20 can be reduced, thereby reducing the protrusion from the circuit board when the electronic device 20 is mounted on the circuit board.

Figure 8:
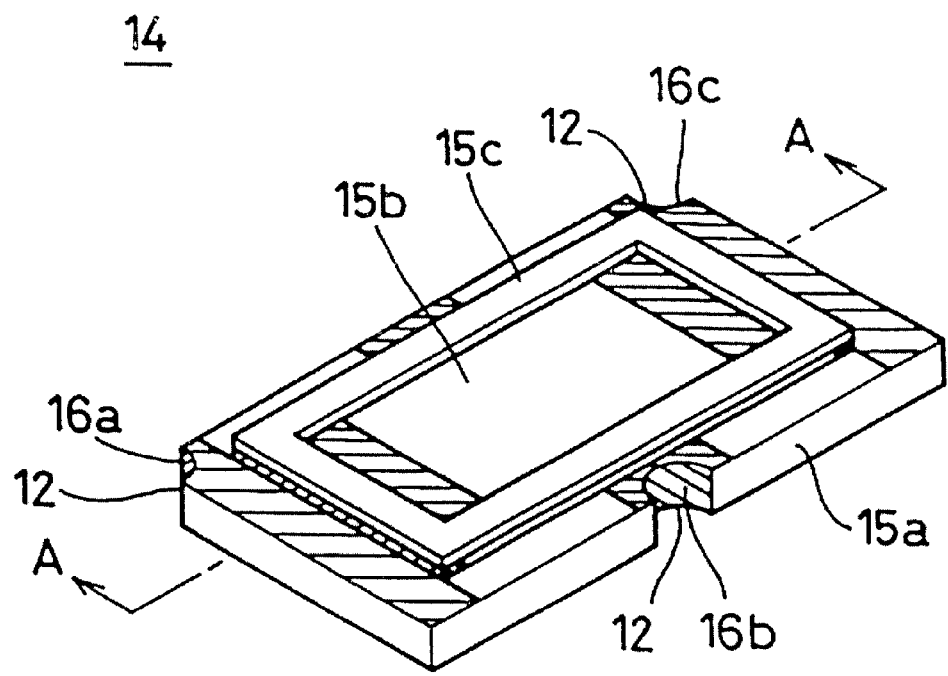
FIG. 8 is a perspective view of a substrate element according to a third preferred embodiment of the present invention.
Figure 9:
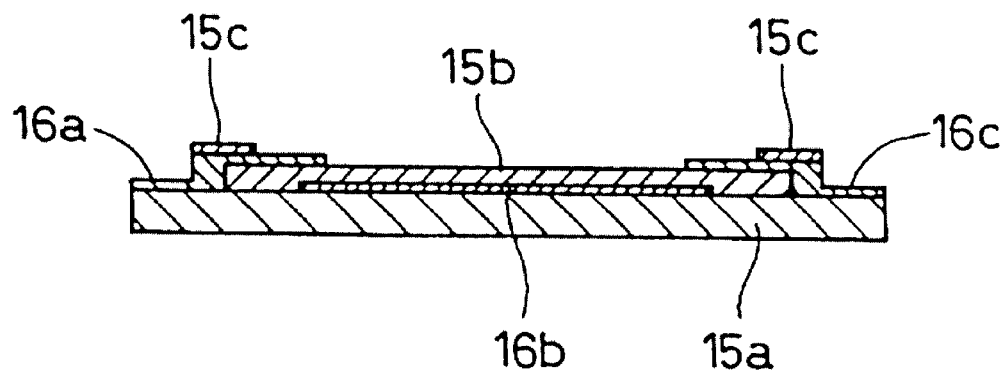
FIG. 9 is a longitudinal-sectional view, along line A—A, of the substrate element shown in FIG. 8.

FIG. 8 is a perspective view of a substrate element according to a third preferred embodiment of the present invention. FIG. 9 is a longitudinal sectional view, along line A—A, of a substrate element 14 shown in FIG. 8. The substrate element 14 shown in FIGS. 8 and 9 includes a multi-layered substrate.

The substrate element 14 shown in FIGS. 8 and 9 includes a first substrate 15a of a material having a low dielectric constant. The first substrate 15a is provided with through-holes 12 forming cut-away parts substantially in a shape of the letter U at the longitudinal ends of one of the lateral sides. The through-holes 12 are provided with terminal electrodes 16a and 16c located on the inner surfaces thereof. The first substrate 15a is provided with a through-hole 12 forming a cut away part substantially in a shape of the letter U at an intermediate part of the other lateral side of the first substrate 15a, the through-hole 12 being provided with a terminal electrode 16b provided on the inner surface thereof. The terminal electrode 16b is extended so as to be exposed in a band at the upper surface of the first substrate 15a. The first substrate 15a is overlaid, on the upper surface thereof through the terminal electrode 16b, with a second substrate 15b of a material having a high dielectric constant. The terminal electrodes 16a and 16c are extended from the longitudinal ends of the first substrate 15a so as to be exposed on the upper surface of the second substrate 15b. The second substrate 15b is overlaid, on the upper surface thereof through the terminal electrodes 16a and 16c, with a third substrate 15c of a material having a low dielectric constant and having a shape of a frame. The substrate element 14 is obtained from the mother substrate 10 overlaid with the first, second, and third substrates 15a, 15b, and 15c in a region in which each substrate element 14 is formed, and by cutting the mother substrate 10 thus arranged along cut lines.

In the substrate element 14 shown in FIGS. 8 and 9, the first and third substrates 15a and 15c made of a material having low dielectric constants and the second substrate 15b made of a material having a high dielectric constant are provided in an integrated form, thereby forming a load capacitance in the substrate element 14. The substrate element 14 includes the third substrate 15c having a frame-shape, whereby the recess formed by the frame-shaped third substrate 15c defines a space for receiving an electronic device element of an electronic device such as a piezoelectric resonator.

Figure 10:
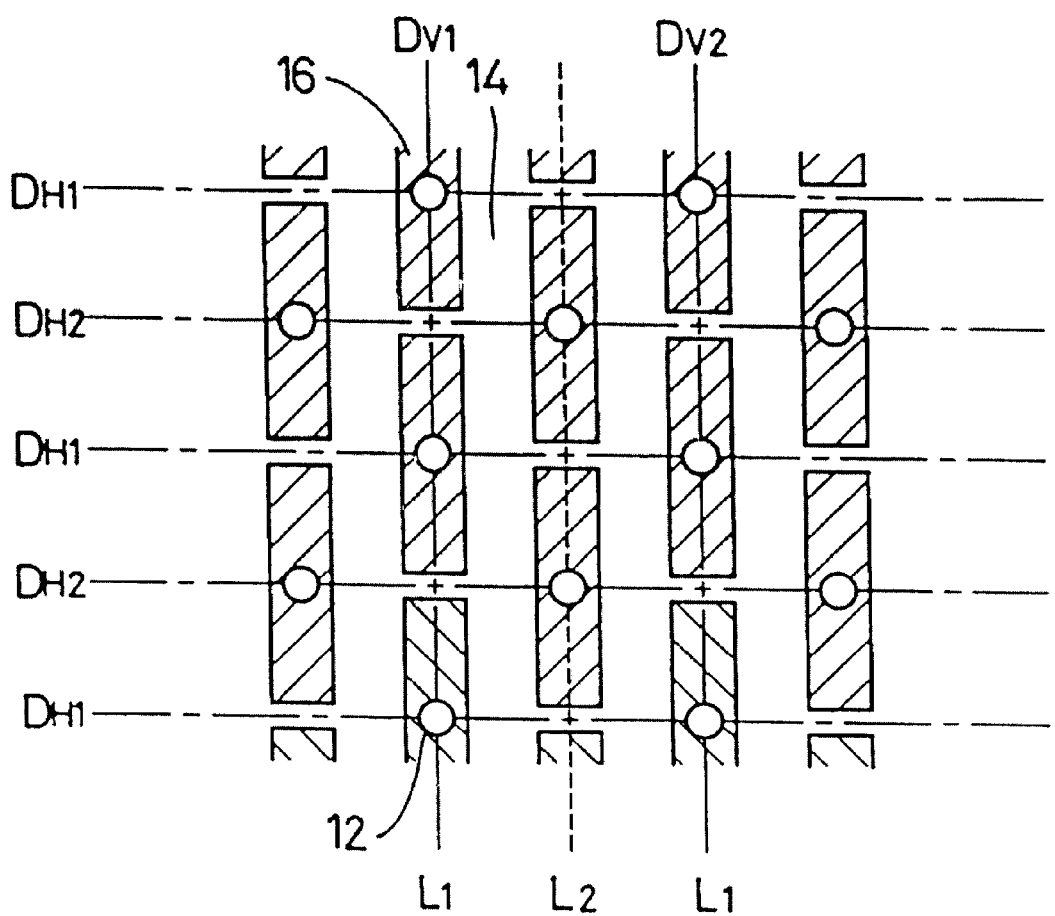
FIG. 10 is a plan view of a modified example of electrode patterns provided on the mother substrate shown in FIG. 1.
Figure 11:
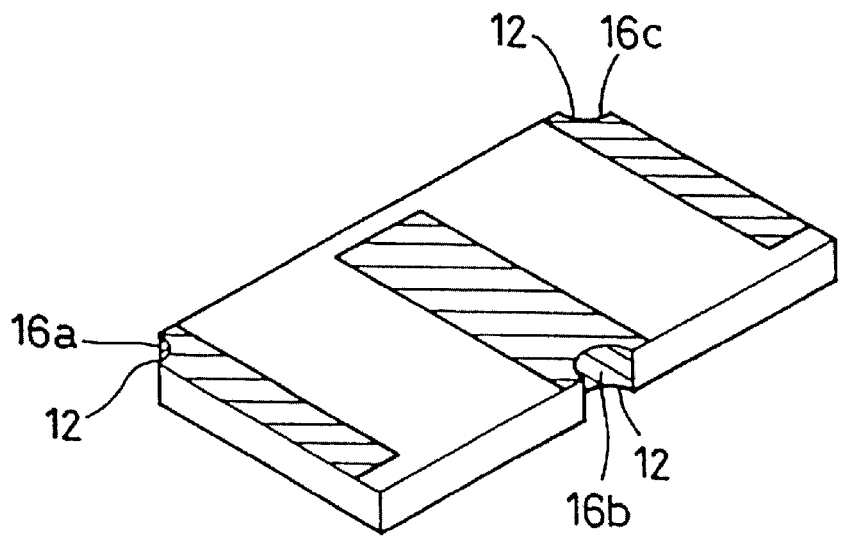
FIG. 11 is a perspective view of a substrate element obtained from the mother substrate shown in FIG. 10.

FIG. 10 is a plan view of a modified example of electrode patterns 16 of the mother substrate 10 shown in FIG. 1. FIG. 11 is a perspective view of a substrate element 14 obtained from a mother substrate 10 shown in FIG. 10. The mother substrate 10 shown in FIG. 10 is different from the mother substrate 10 shown in FIG. 1 in that electrode patterns 16 of the mother substrate 10 shown in FIG. 10 are formed in pieces separated by gaps which are disposed on cut lines $D_{H1}$ and $D_{H2}$. The electrode patterns 16 may be modified according to the use of the substrate element 14. The electrode patterns 16 may have substantially the same shape on the upper surface as that which is provided on the bottom surface of the substrate element 14, or they may have shapes that are different from each other.

Figure 12:
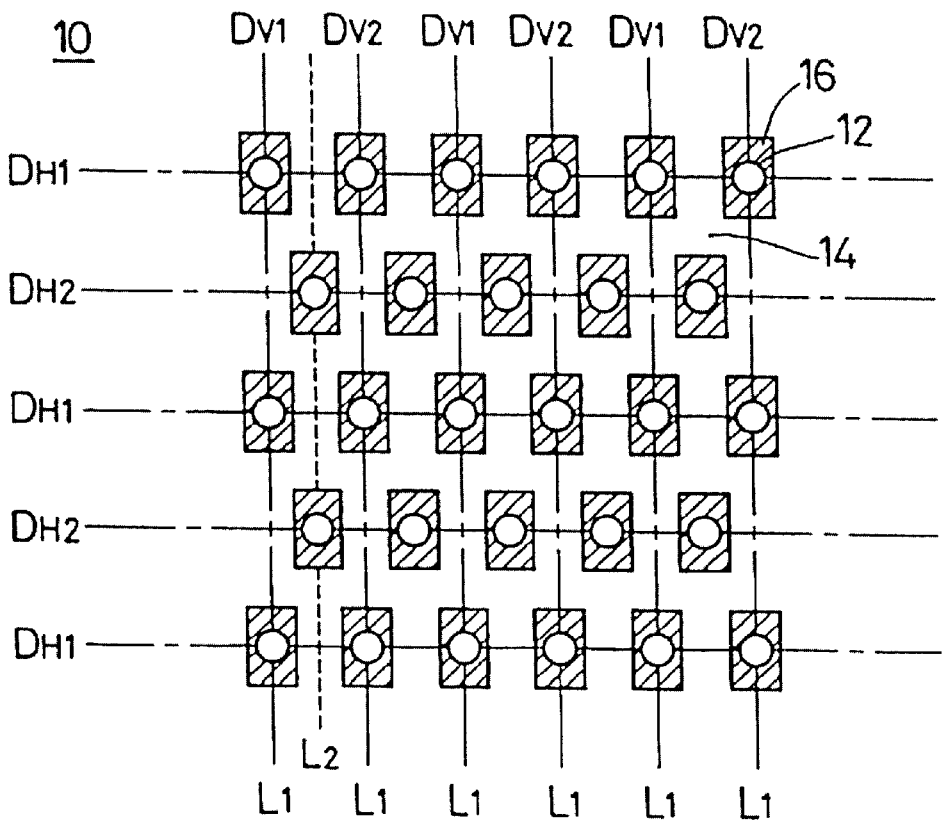
FIG. 12 is a plan view of a modified example of the mother substrate shown in FIG. 10.
Figure 13:
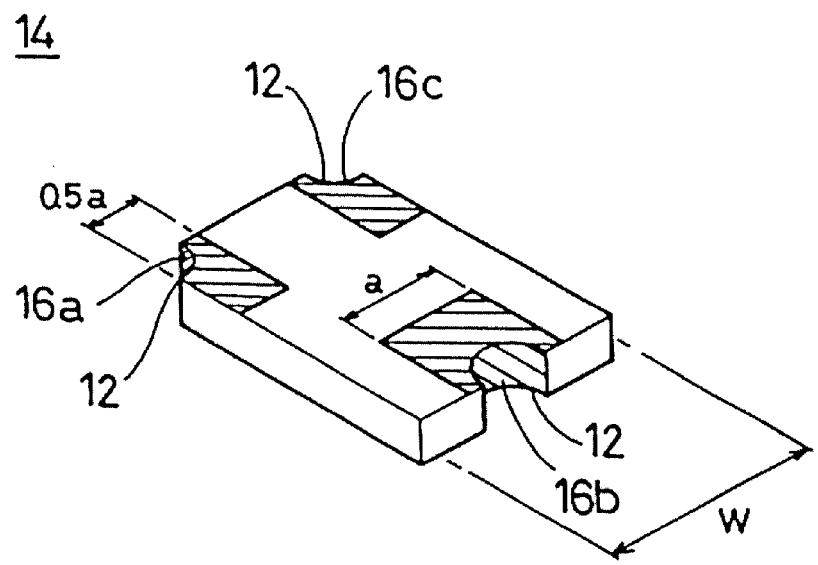
FIG. 13 is a perspective view of a substrate element obtained from the mother substrate shown in FIG. 12.

FIG. 12 is a plan view of a modified example of the mother substrate 10 shown in FIG. 10. FIG. 13 is a perspective view of a substrate element 14 obtained from a mother substrate 10 shown in FIG. 12. The mother substrate 10 shown in FIG. 12 includes the substrate elements 14, the area of each being reduced, whereby the density of through-holes 12 is increased. Each of the through-holes 12 has electrodes provided around the through-hole 12 and on the inner surface thereof.

In a conventional substrate element 14 shown in FIG. 12 in which a plurality of pairs of through-holes 12 are formed, each pair of the through-holes 12 being disposed to oppose each other in the width direction of the substrate element 14, the size of the substrate element 14 is required to satisfy the expression W>3a+α, in which W denotes the overall length of the substrate element 14, a denotes the width of an electrode pattern provided on the through-holes 12, and α denotes the size of a gap to be provided to prevent breakage of the substrate element 14 and short-circuits between terminal electrodes.

In contrast, in the substrate element 14 according to preferred embodiments of the present invention, the through-holes 12 are arranged in a staggered manner, whereby only one through-hole 12 is provided in two positions of the lateral sides of the substrate element 14, the two positions opposed to each other in the width direction of the substrate element 14. With this arrangement, the substrate element 14 may have a size satisfying the expression W<3a, as shown in FIG. 13, thereby providing a further miniaturized substrate element 14 according to the modified example.

Figure 14:
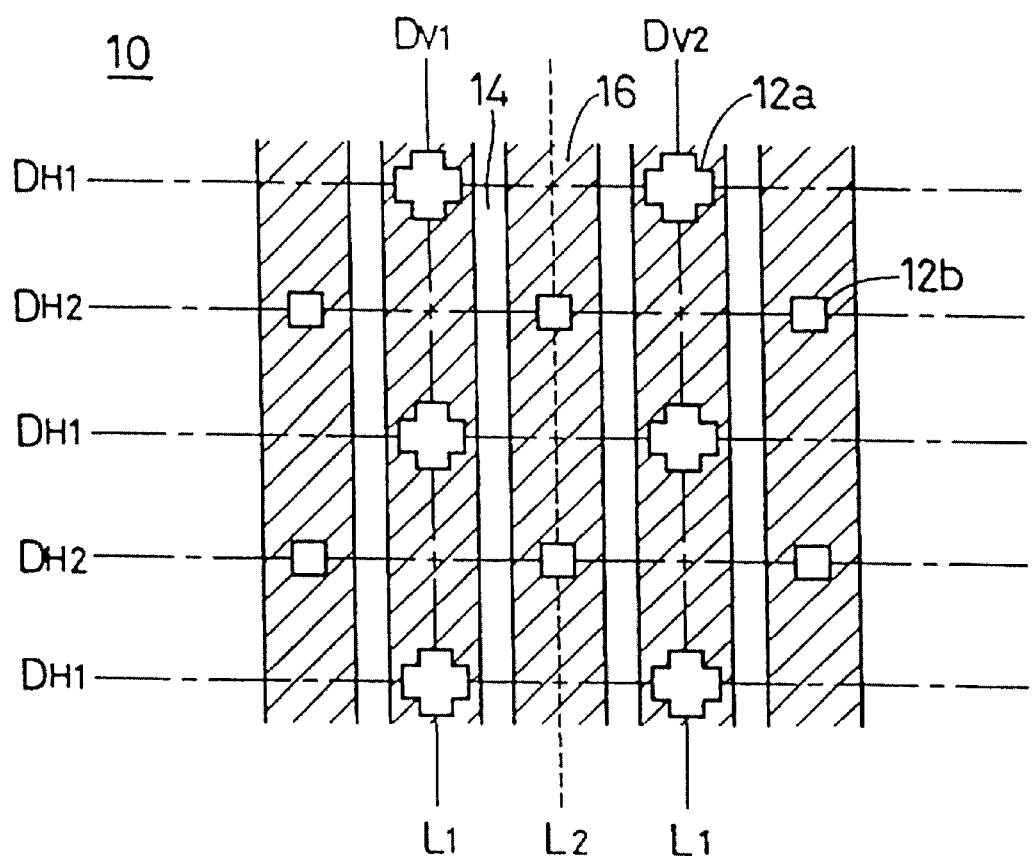
FIG. 14 is a plan view of a modified example of through-holes provided in the mother substrate shown in FIG. 1.
Figure 15:
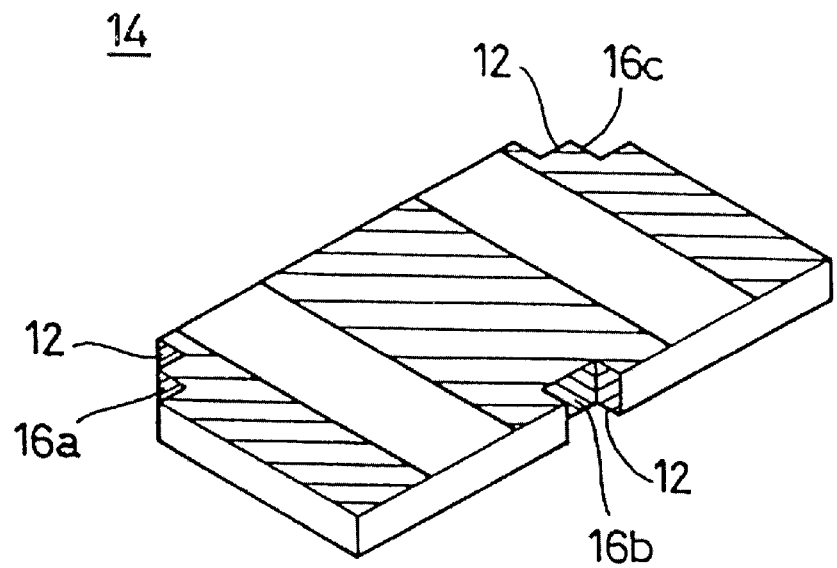
FIG. 15 is a perspective view of a substrate element obtained from the mother substrate shown in FIG. 14.

FIG. 14 is a plan view of a modified example of through-holes 12 of the mother substrate 10 shown in FIG. 1. FIG. 15 is a perspective view of the substrate element 14 obtained from a mother substrate 10 shown in FIG. 14. The mother substrate 10 shown in FIG. 14 is different from the mother substrate 10 shown in FIG. 1 in that the mother substrate 10 shown in FIG. 14 is provided with through-holes 12a, having substantially a shape of the symbol +, located on first lines $L_1$ which are first and second cut lines $D_{V1}$ and $D_{V2}$ vertically extending in the drawing, and is provided with substantially rectangular through-holes 12b located on second lines $L_2$ which are separated from the first and second cut lines $D_{V1}$ and $D_{V2}$. According to-this modified example, the substrate element 14 shown in FIG. 15 can be obtained, in which the substrate element 14 is provided with a terminal electrode 16b provided on the inner surface of the through-hole 12 cut away, substantially in a U-shape, in an intermediate part of one of the lateral side surfaces, opposing in the width direction, of the substrate element 14, and terminal electrodes 16a and 16c on the inner surfaces of the through-holes 12 cut away, substantially in a W-shape, at the longitudinal ends of the other one of the lateral side faces, opposing each other in the width direction, of the substrate element 14. The shape of the through-holes 12 is not limited to that which is described above, and the through-holes 12 may be formed in various shapes according to the use of the substrate element 14.

Figure 16:
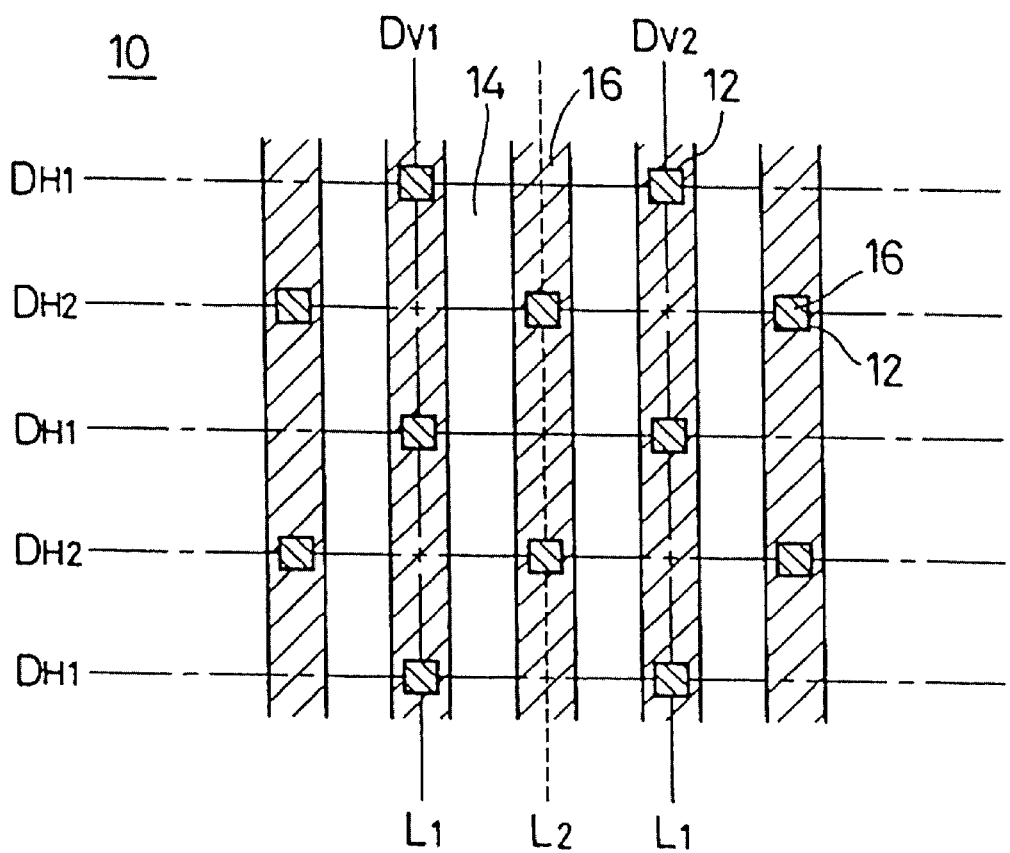
FIG. 16 is a plan view of another modified example of the through-holes in the mother substrate shown in FIG. 1.
Figure 17:
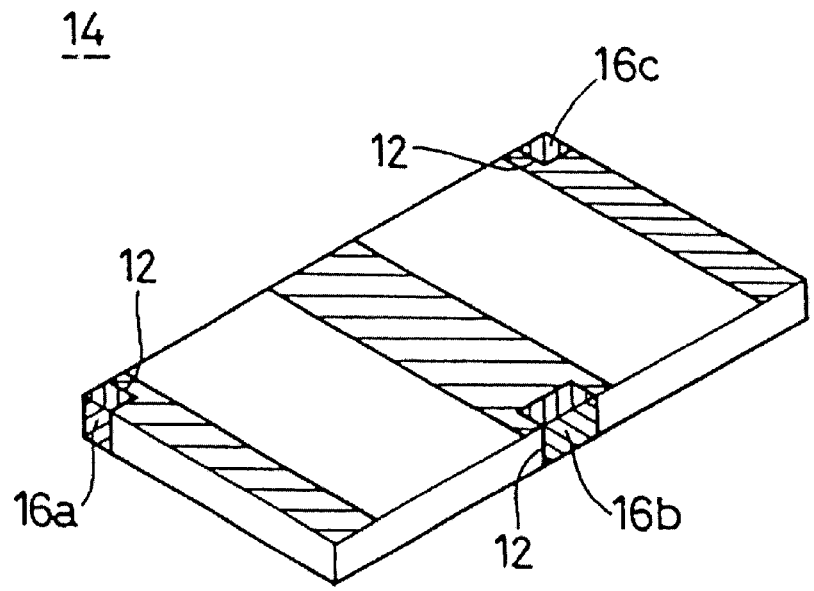
FIG. 17 is perspective view of a substrate element obtained from the mother substrate shown in FIG. 16.

FIG. 16 is a plan view of another modified example of through-holes 12 of the mother substrate 10 shown in FIG. 1. FIG. 17 is a perspective view of a substrate element 14 obtained from a mother substrate 10 shown in FIG. 16. The mother substrate 10 shown in FIG. 16 is different from the mother substrate 10 shown in FIG. 1 in that the through-holes 12 of the mother substrate 10 shown in FIG. 16 are formed in substantially a rectangular shape, and are filled with the same conductive material 16 as a material of the electrode patterns 16. The substrate element 14 shown in FIG. 17 is obtained, according to this modified example, which is provided with electrodes 16a, 16b, and 16c by filling the through-holes 12 with the conductive material 16. When surface-mounting an electronic device 20 including the substrate element 14 shown in FIG. 16, it is not necessary to be concerned with conductive materials and sealing materials penetrating into the through-holes 12 because the through-holes 12 are filled with the conductive material 16. With this arrangement, the conductive material and insulating material can be applied in a large area, thereby providing, reliable electronic devices.

Figure 18:
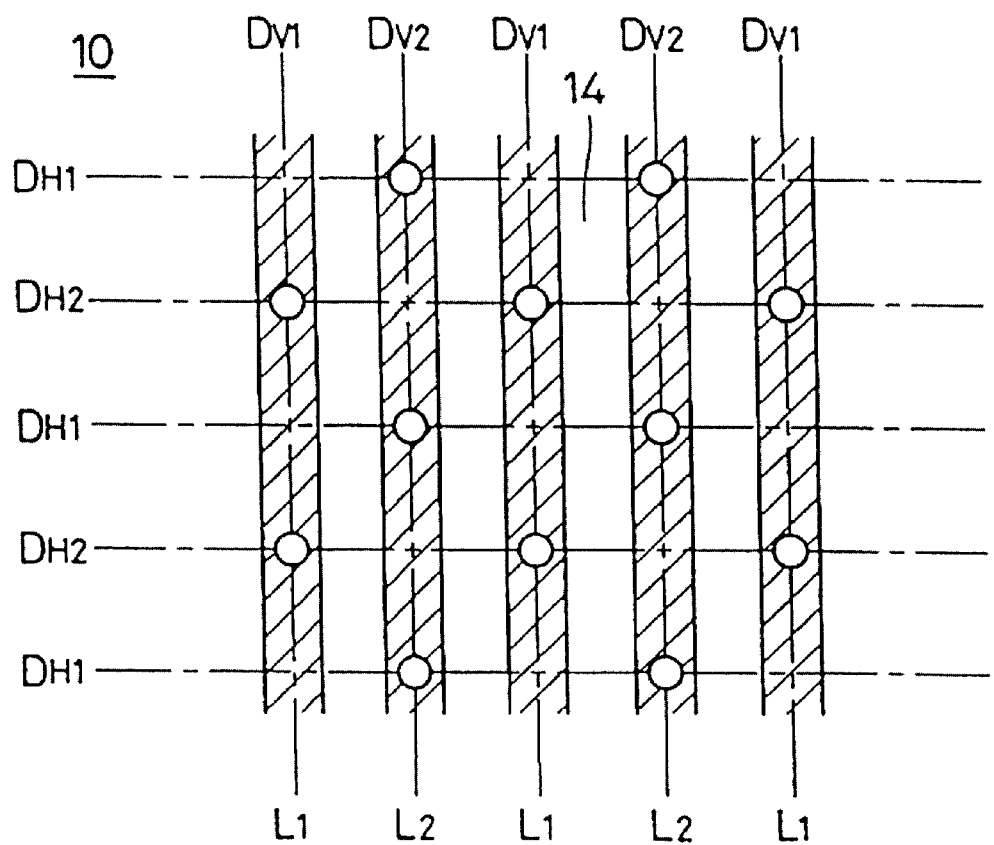
FIG. 18 is a plan view showing a method for manufacturing substrate elements according to a fourth preferred embodiment of the present invention.
Figure 19:
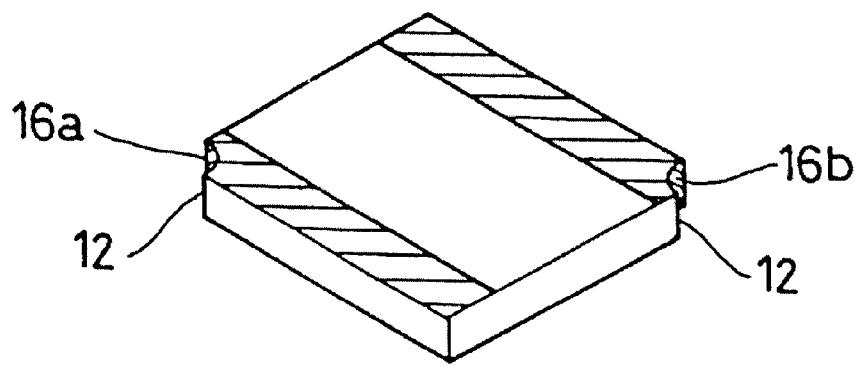
FIG. 19 is a perspective view of a substrate element obtained by the method described with reference to FIG. 18.
Figure 20:
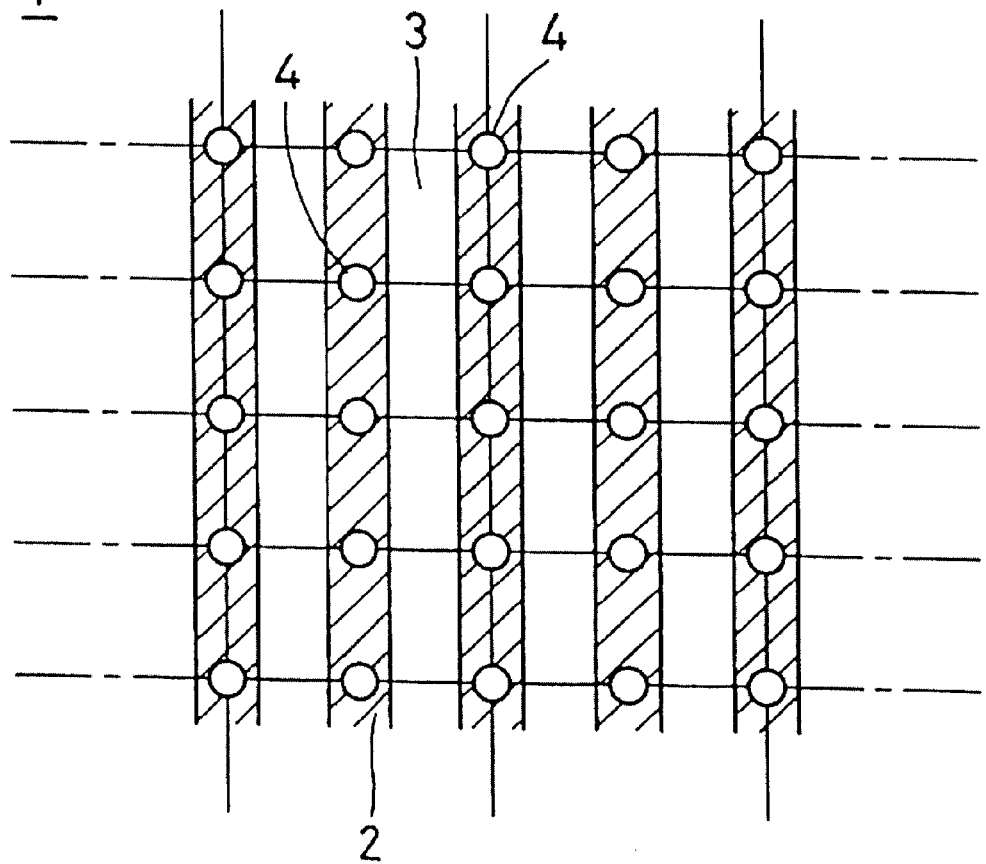
FIG. 20 is a plan view of a conventional mother substrate.

FIG. 18 is a plan view showing a method for manufacturing a substrate element according to a fourth preferred embodiment of the present invention. FIG. 19 is a perspective view of a substrate element 14 obtained by this method. A mother substrate 10 shown in FIG. 18 is different from the mother substrate 10 shown in FIG. 1 in that cut lines $D_{V1}$ and $D_{V2}$ vertically extending, as shown in FIG. 18, are disposed in a different manner as that in which the cut lines $D_{V1}$ and $D_{V2}$ are disposed in FIG. 1, the configuration being the same except for the above. The first and second cut lines $D_{V1}$ and $D_{V2}$ shown in FIG. 1 extend vertically, passing through only on the through-holes 12 disposed on the first cut lines $D_{H1}$ extending horizontally, and the through-holes 12 disposed on the second cut lines $D_{H2}$ are not divided by any of the cut lines extending vertically. With the arrangement according to the first preferred embodiment, the substrate element 14 having three terminals shown in FIG. 2 is obtained from the mother substrate 10 shown in FIG. 1. But, according to the fourth preferred, embodiment, as shown in FIG. 18, first vertical cut lines $D_{V1}$ extend passing through the through-holes 12 disposed on second horizontal cut lines $D_{H2}$, and second vertical cut lines $D_{V2}$ extend passing through the through-holes 12 disposed on first horizontal cut lines $D_{H1}$. According to the fourth preferred embodiment, first lines $L_1$ are on the first vertical cut lines $D_{V1}$, and second lines $L_2$ are on the second vertical cut lines $D_{V2}$. The substrate element 14 having two terminals is provided, as shown in FIG. 19, by cutting the mother substrate 10 shown in FIG. 18 along the cut lines $D_{V1}$, $D_{V2}$, $D_{H1}$, and $D_{H2}$ by a known cutting mechanism such as a dicer.

According to various preferred embodiments of the present invention, a miniaturized substrate element is obtained. The mother substrate according to preferred embodiments of the present invention is provided with through-holes disposed on each cut line alternately with the through-holes on the adjacent cut line, thereby reducing the number of through-holes, whereby the manufacturing cost of substrate elements is greatly reduced. Furthermore, the breakage of substrates and the short-circuits between through-holes, when miniaturizing the substrate element, is prevented by virtue of the configuration of the substrate element according to preferred embodiments of the present invention, thereby providing further miniaturized substrate elements. Also, by reducing the number of through-holes, the area for sealing materials and conductive materials to be applied can be relatively increased, whereby reliable electronic devices can be obtained.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A mother substrate for forming substrate elements by cutting the mother substrate along a plurality of intersecting cut lines, the mother substrate comprising:
   a plurality of sections on the mother substrate each being defined by an area between two pairs of said plurality of intersecting cut lines;
   a region in which a plurality of through-holes are formed at a predetermined distance from each other and on each of said plurality of cut lines;
   wherein the through-holes on each of the plurality of cut lines are disposed alternately with respect to the through-holes on an adjacent one of the cut lines, such that no two adjacent cut lines have through-holes formed at the same position thereon; and
   each of said plurality of sections includes side edges and corners where said side edges intersect such that at least two of said plurality of through holes are provided at the corners thereof and at least one of said plurality of through holes is provided at an approximate center of one of said side edges.

2. The mother substrate of claim 1, further comprising electrode patterns extended in a line along said cut lines.

3. The mother substrate of claim 2, wherein said electrode patterns cover substantially an entire inner surface of each through-hole.

4. The mother substrate of claim 1, wherein said mother substrate further comprises recessed areas within an area bounded by said cut lines.

5. The mother substrate of claim 1, further comprising a second substrate on said mother substrate.

6. The mother substrate of claim 2, wherein said electrode patterns extended in a line have gaps along said line.

7. The mother substrate of claim 1, further comprising electrode patterns disposed substantially around said through-holes, said electrode patterns substantially covering an inner surface of said through-holes.

8. The mother substrate of claim 1, wherein said through holes have an approximate shape of at least one of a cross, a rectangle, and a circle.

9. A mother substrate comprising:
   a plurality of sections disposed in vertical and horizontal directions and said sections being associated with substrate elements to be formed by cutting the mother substrate along cut lines extending in the vertical and horizontal directions;
   a plurality a first cut lines extending along a line, said first cut lines opposing each other across the section associated with each of the substrate elements to be formed, and said first cut lines having a plurality of first through-holes on said first cut lines, said first through-holes disposed at a predetermined distance from each other; and
   a plurality of second cut lines extending on another line, said second cut lines opposing each other across the section associated with each of the substrate elements to be formed, and said second cut lines having a plurality of second through-holes on said second cut lines, said second through-holes disposed at a predetermined distance from each other;
   wherein the first through-holes and the second through-holes are disposed alternately with respect to each other such that a first line which passes through the first through-holes disposed on the first cut line, and which extends substantially perpendicular to said first cut line, is separated and spaced from a second line which passes through the second through-holes disposed on the second cut line, and which extends substantially perpendicular to said second cut line, and none of the first through-holes are disposed at the same position on the first cut lines as any of the second through-holes on the second cut lines; and
   each of said plurality of sections being defined by an area between one pair of said plurality of first cut lines and one pair of said plurality of second cut lines that intersect with said one pair of said plurality of first cut lines, and includes side edges and corners where said side edges intersect such that at least two of said first and second through holes are provided at the respective corners thereof and at least another one of said first and second through holes is provided at an approximate center of at least one of said side edges.

10. An electronic device, comprising:
    a substrate element having side edges and corners where said side edges intersect, the substrate element being manufactured by a method including the steps of providing a mother substrate having substantially parallel cut lines, forming a plurality of through-holes on each of said cut lines at a predetermined distance from each other, said through-holes alternately disposed with respect to through-holes on an adjacent cut line such that no two adjacent cut lines have through-holes formed at the same position thereon, and cutting said mother substrate along said cut lines; and
    an electronic device element mounted on said substrate element; wherein
    said substrate element includes at least two of said through-holes provided at respective corners thereof and at least one of said through-holes provided at an approximate center of at least one of said side edges.

11. An electronic component comprising:

a substrate element having side edges and corners where said side edges intersect, the substrate element being manufactured by a method including the steps of providing a mother substrate, forming a plurality of first cut lines extending along a line and substantially parallel to each other on said mother substrate, forming a plurality of second cut lines extending along another line and substantially parallel to each other on said mother substrate, forming a plurality of first through-holes and a plurality of second through-holes on said first cut lines and said second cut lines, respectively, and alternately disposing said first and second through-holes at a predetermined distance from each other such that a first line extending substantially perpendicular to said first cut line and passing through the first through-holes disposed on the first cut line is separated and spaced from a second line extending substantially perpendicular to said second cut line and passing through the second through-holes disposed on the second cut lines, and none of the first through-holes are disposed at the same position on the first cut lines as any of the second through-holes on the second cut lines; and an electronic device element mounted on said substrate element; wherein said substrate element includes at least two of said first and second through-holes provided at respective corners thereof and at least another one of said first and second through-holes provided at an approximate center of at least one of said side edges.

* * * * *